(12) United States Patent
Mityashin et al.

(10) Patent No.: US 11,069,648 B2
(45) Date of Patent: Jul. 20, 2021

(54) SEMICONDUCTOR STRUCTURE AND METHOD FOR OBTAINING LIGHT EMITTING DIODES RECONSTITUTED OVER A CARRIER SUBSTRATE

(71) Applicant: IMEC VZW, Leuven (BE)

(72) Inventors: Alexander Mityashin, Heverlee (BE); Soeren Steudel, Oud-Heverlee (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/705,702

(22) Filed: Dec. 6, 2019

(65) Prior Publication Data

US 2020/0185351 A1 Jun. 11, 2020

(30) Foreign Application Priority Data

Dec. 10, 2018 (EP) ..................................... 18211326

(51) Int. Cl.
*H01L 23/00* (2006.01)
*H01L 25/075* (2006.01)
(Continued)

(52) U.S. Cl.
CPC .......... *H01L 24/80* (2013.01); *H01L 25/0756* (2013.01); *H01L 27/156* (2013.01);
(Continued)

(58) Field of Classification Search
CPC combination set(s) only.
See application file for complete search history.

(56) References Cited

U.S. PATENT DOCUMENTS

2008/0182382 A1\* 7/2008 Ingle ................. H01L 21/76232
438/435
2012/0187412 A1\* 7/2012 D'Evelyn ........... H01L 21/6835
257/76
(Continued)

FOREIGN PATENT DOCUMENTS

WO 2018/169968 A1 9/2018

OTHER PUBLICATIONS

European Search Report, European Patent Application No. 18211326.6, dated Jun. 7, 2019, 6 pages.
(Continued)

*Primary Examiner* — Ratisha Mehta
(74) *Attorney, Agent, or Firm* — McDonnell Boehnen Hulbert & Berghoff LLP

(57) ABSTRACT

A method is provided for obtaining one or more Light Emitting Diode (LED) devices reconstituted over a carrier substrate. The method includes providing a silicon-based semiconductor substrate as the carrier substrate; providing, per each of the one or more LED devices, a compound semiconductor stack including an LED layer; applying a SiCN layer to the stack and the substrate, respectively; bonding the stack to the substrate, wherein the SiCN layer applied to the stack and the SiCN layer applied to the substrate are contacted; and annealing, after bonding, the bonded stack and substrate at a temperature equal to or higher than a processing temperature for completing the LED device from the stack, wherein said temperatures are at least 400° C. A semiconductor structure including the one or more LED devices reconstituted over a carrier substrate is also provided.

18 Claims, 5 Drawing Sheets

(51) Int. Cl.
  *H01L 27/15*  (2006.01)
  *H01L 33/00*  (2010.01)
  *H01L 33/32*  (2010.01)
(52) U.S. Cl.
  CPC ............ *H01L 33/005* (2013.01); *H01L 33/32* (2013.01); *H01L 2933/0033* (2013.01)

(56) References Cited

U.S. PATENT DOCUMENTS

2016/0231083 A1*  8/2016  Regan .................. F41G 3/06
2017/0154881 A1   6/2017  Shao et al.
2017/0301646 A1   10/2017 Kim et al.
2019/0148336 A1*  5/2019  Chen .................. H01L 24/24
                                                                  257/774
2019/0371779 A1*  12/2019 Yeon .................. H01L 25/18

OTHER PUBLICATIONS

Vandooren, A. et al., "Sequential 3D: Key Integration Challenges and Opportunities for Advanced Semiconductor Scaling", Session G—3D & Advanced Transistors/Material, ICICDT 2018, pp. 145-148.

* cited by examiner

SEMICONDUCTOR STRUCTURE AND METHOD FOR OBTAINING LIGHT EMITTING DIODES RECONSTITUTED OVER A CARRIER SUBSTRATE

CROSS-REFERENCE TO RELATED APPLICATIONS

The present application is a non-provisional patent application claiming priority to European Patent Application No. 18211326.6, filed Dec. 10, 2018, the contents of which are hereby incorporated by reference.

FIELD OF THE DISCLOSURE

The present disclosure presents relates to the technical field of Light Emitting Diode (LED) devices, in particular of micro-LED (μLED) devices. In this technical field, the disclosure proposes a method for obtaining one or more LED devices reconstituted over a carrier substrate. For example, one or more GaN LED devices reconstituted over a 300 mm silicon-based carrier wafer. The proposed method includes particularly a bonding of one or more compound semiconductors stacks to the carrier substrate, wherein the LED devices may then be completed from the bonded compound semiconductor stacks. The method can be particularly applicable in a process for fabricating a μLED device suitable for a μLED display.

BACKGROUND OF THE DISCLOSURE

In a fabrication process of a device, it may be beneficial to first bond a material stack or material layers, particularly semiconductor material, to a carrier substrate. The obtained material stacks reconstituted over the carrier substrate may then be processed more efficiently or easier to complete the device.

A conventional method for such bonding of material stacks or layers to a carrier substrate is, for example, described in US 2017/0301646 A1. The bonding method includes a pre-bond annealing step at a temperature between 400-450° C. and a post-bond annealing step at a temperature of 250° C. or less. The method relates to creating a silicon-to-silicon bond, and may be suitable for bonding two silicon wafers comprising Front End of Line (FEOL) and/or Back End of Line (BEOL) layers.

Also in a fabrication process of a LED device including a LED array, particularly a μLED array with very tightly spaced LEDs, it would be beneficial to first bond a plurality of compound semiconductor stacks to a silicon-based carrier substrate, in order to process each bonded stack into one such LED device.

However, since compound semiconductor stacks (e.g. made from III-V or II-VI semiconductor material) can in this case be bonded to a silicon-based carrier substrate, there may be a material mismatch of the bonded parts. This may cause problems, if the further processing of the bonded stacks into the LED devices requires a high-temperature processing step. As an example, in order to obtain GaN-based LED devices reconstituted over a silicon wafer, a p-type contact formation onto GaN-based stacks bonded to the wafer may be usually required. The temperature applied during this contact formation process can be typically as high as 550° C.

Due to the material mismatch of the bonded parts, and thus different thermal expansion coefficients, the bonds created between the compound semiconductor stacks and the silicon-based carrier substrate may deteriorate during the high-temperature processing step. In particular, the different thermal expansion coefficients lead to a large thermal stress, which may weaken or even destroy the bonds between the stacks and the carrier substrate.

Notably, for such a fabrication process of a LED device, the bonding method described in US2017/0301646A1 may not be suitable, since severe reliability issues of the bonds after the high-temperature processing can be experienced.

SUMMARY OF THE DISCLOSURE

In view of the above-mentioned problems, embodiments of the present disclosure aim to improve the conventional process of fabricating a LED device, particularly of obtaining one or more LED devices reconstituted over a silicon-based carrier substrate. An objective is in particular to provide a bonding method that creates a bond between one or more compound semiconductor stacks and a silicon-based carrier substrate, which can be strong enough to withstand a subsequent high-temperature processing step, which may be used to manufacture an LED device per each stack.

The objective of the present disclosure can be achieved by the embodiments of the disclosure provided in the enclosed independent claims. Various implementations of these embodiments are defined in the dependent claims.

In particular, the embodiments of the disclosure can be based on the assumption that the higher the subsequent processing temperature and the associated thermal stress is, the higher the bond strength of the bond between the carrier substrate and the one or more compound semiconductor stacks has to be, in order to counter the thermal stress. Further, the embodiments of the disclosure can be based on the recognition of the specific application scenario of fabricating LED devices, wherein a compound semiconductor stack, from which an LED device can be made, includes no FEOL and/or BEOL structuring. Further, wherein the silicon-based carrier substrate may be a blank, unstructured substrate.

The solution provided by the embodiments of the disclosure can be to use a bonding material with a maximum bond strength, particularly SiCN, and to perform—after the bonding of stacks and carrier substrate—a post-bond annealing at a temperature, which is in the range of a maximum temperature of subsequently required processing, e.g. is at least as high as the temperature required for the above-mentioned contact formation.

A first aspect of the disclosure relates to a method for obtaining one or more LED devices reconstituted over a carrier substrate, the method comprising: providing a silicon-based semiconductor substrate as the carrier substrate, providing, per each of the one or more LED devices, a compound semiconductor stack including an LED layer, applying a silicon carbon nitride, SiCN, layer to the stack and the substrate, respectively, bonding the stack to the substrate, wherein the SiCN layer applied to the stack and the SiCN layer applied to the substrate may be contacted, annealing, after bonding, the bonded stack and substrate at a temperature equal to or higher than a processing temperature for completing the LED device from the stack, wherein said temperatures may be at least 400° C.

An LED device may include one or more LED, but may also include one or more LED arrays. Thereby, a LED array may be a μLED array.

Due to the selection of the bonding material (SiCN) and the applying of a high post-bond annealing temperature of at least 400° C., a very high bonding strength between the compound semiconductor stack and the silicon-based carrier substrate can be achieved. Thus, the bond will not likely deteriorate during the subsequent completion of the LED device from the stack, which can be carried out at high temperatures—but not higher than the post-bond annealing. Thus, one or more LED devices reconstituted over the carrier substrate can be more reliably obtained, and the process for fabricating LED devices, particularly including a μLED array each, can result in significantly higher yields.

Notably, the high temperature post-bond annealing step, which can be applied in the method of the first aspect, can be possible because the silicon-based carrier substrate, on which the compound semiconductor stacks can be bonded may—in the particular process of fabricating an LED device—only be a temporary carrier without any active structures (e.g. transistors, BEOL). Further, because the used compound semiconductor stacks, which include the LED layers, may still be blank dies without any structuring before they can be processed into the LED devices. Any such structures or structuring would severely limit the temperature available for the post-bond annealing, since they would be destroyed or at least harmed. For instance, the bonding method of the first aspect would not be possible in the application scenario of US 2017/0301646 A1, since there already structured components that are bonded together, for which higher post-bond annealing temperatures than the selected 250° C. can result in severe degradation of these devices and/or Cu diffusion.

In an implementation form of the method, the annealing, after bonding, can be performed at a temperature equal to or higher than 550° C.

Annealing the bonded structures above this temperature results in specifically high bonding strengths. Furthermore, in this case the post-bond annealing temperature can be equal to or higher even than the temperature required for fabricating contacts on the compound semiconductor stacks.

In an implementation form of the method, the annealing, after bonding, can be performed for a duration ranging between 30 minutes and 5 hours.

In particular, the annealing may be done for 2 hours at a temperature ranging between 400 to 550° C.

In an implementation form of the method, the processing temperature for completing the LED device from the stack is equal to or lower than 550° C.

In an implementation form of the method, completing the LED device from the stack comprises forming a top contact on the stack, particularly a p-contact, to contact the LED layer.

The method may also comprise forming a bottom contact, particularly an n-contact, which may also be done at a temperature as high as 400° C. However, only the top contact can be annealed at a temperature of or above 400° C.

In an implementation form of the method, the silicon-based semiconductor substrate may be in the form of a 300 mm wafer.

In particular, the silicon-based 300 mm wafer may be an unstructured carrier wafer, which does not yet include any FEOL/BEOL layers. The carrier wafer can allow for the obtainment of a very high number of reconstituted LED devices.

In an implementation form of the method, the compound semiconductor stack comprises a III-V semiconductor material compound, a II-VI semiconductor material compound, or a metal-nitride compound.

In an implementation form of the method, the compound semiconductor stack includes a GaN-based LED layer.

In an implementation form of the method, applying the SiCN layers comprises: forming a SiN layer or a polished dielectric on the stack and the substrate, respectively, and forming the SiCN layers on the respective SiN layers or polished dielectrics.

In this way, the bonding strength of the bond between the one or more compound semiconductor stacks and the silicon-based carrier substrate may be further improved.

In an implementation form, the method further comprises performing a planarization of the SiCN layers, before bonding, to obtain a surface roughness of the SiCN layers of below 1 nm.

In this way, the bonding strength of the bond between the one or more compound semiconductor stacks and the silicon-based carrier substrate may be further improved, since the formation of chemical bonds may be facilitated.

In an implementation form, the method further comprises annealing, before bonding but after applying the SiCN layers, the stack and substrate at a temperature of at least 400° C., particularly ranging between 400-600° C.

In an embodiment, applying such a pre-bond annealing step at temperatures of at least 400° C. may be desirable since it can outgas the SiCN layers before the bonding, so that no outgassing occurs after the bonding, for example, during the post-bond annealing or further processing steps at higher temperatures. Accordingly, the bonds can be even less likely to deteriorate.

In an implementation form of the method, the annealing, before bonding, may be performed for a duration ranging between 30 minutes and 5 hours, in particular for a duration of 2 hours.

In an implementation, the method provides for obtaining a plurality of LED devices reconstituted over the carrier substrate, wherein a plurality of the compound semiconductor stacks may be provided corresponding to each of the plurality of LED devices, bonded to the substrate, and collectively annealed at the temperature equal to or higher than the processing temperature.

In this implementation, the method may be particularly suited to fabricate multiple LED devices, each e.g. including a LED or μLED array, at the same time.

In an implementation form of the method, the LED device includes a LED array that has an LED pixel pitch equal to or below 3 μm.

That is, a LED array, in which the LEDs may be spaced very closely together, may be processed from each stack. Such e.g. μLED arrays may be used for μLED displays.

In the method of the first aspect and its implementation forms, a thermal budget of annealing after bonding may be generally equal to or higher than a thermal budget of completing the LED device from the stack, and/or a thermal budget of annealing before bonding may be generally equal to or higher than a thermal budget of annealing after bonding.

A second aspect of the disclosure relates to a semiconductor structure including one or more LED devices reconstituted over a carrier substrate, wherein the semiconductor structure may be obtained by the method of the first aspect or any of its implementations.

The semiconductor structure of the second aspect, which may be obtained with the method of the first aspect, can be further processed to obtain one or more LED devices including each a LED array, particularly a μLED array.

BRIEF DESCRIPTION OF THE DRAWINGS

The above described aspects and implementations can be explained in the following description of embodiments with respect to the enclosed drawings.

DETAILED DESCRIPTION OF THE DISCLOSURE

Figure 1:
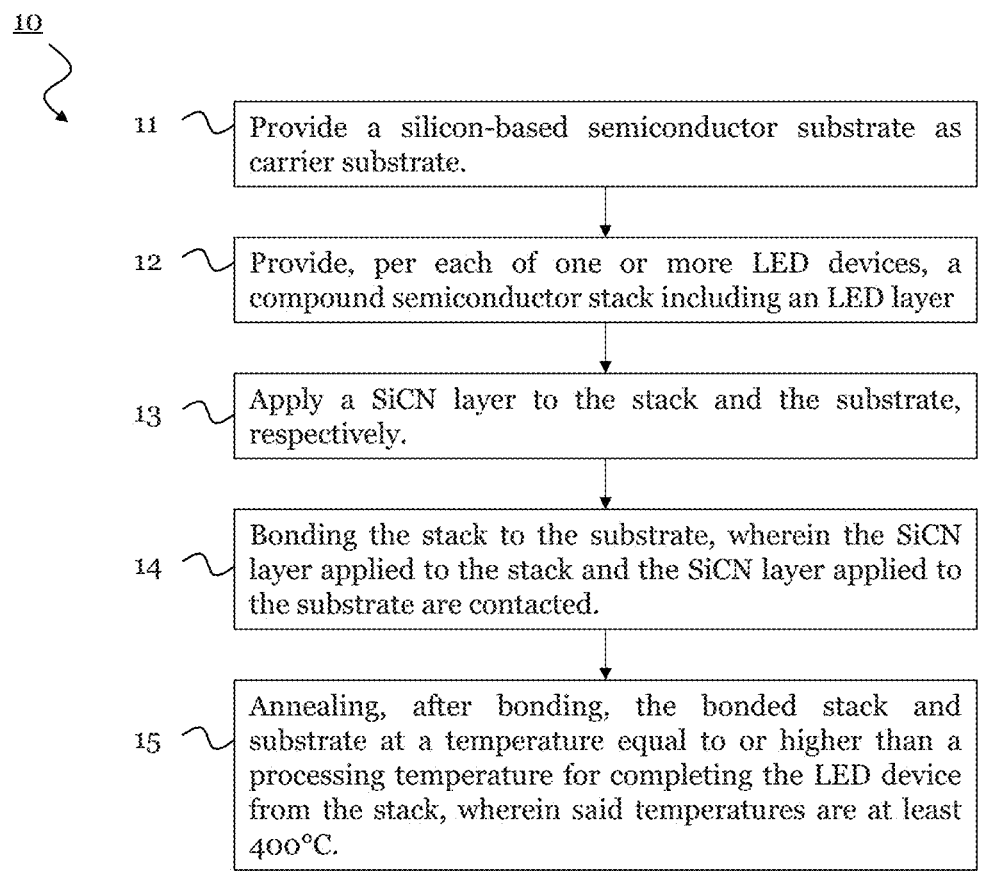
FIG. 1 shows a flow-diagram of a representative method according to an embodiment of the disclosure.

FIG. 1 shows a method 10 according to an embodiment of the disclosure in a schematic flow-diagram. The method 10 may be particularly suitable to obtain one or more LED devices reconstituted over a carrier substrate. The LED devices may e.g. include a LED array each, particularly a µLED array. Thus, the method 10 can be applied in a fabrication process of such LED devices.

In a first step 11 of the method 10, a silicon-based semiconductor substrate may be provided as the carrier substrate. The silicon-based carrier substrate may be a pure silicon substrate or a silicon wafer, but may also include or be based on SiN, or may include or be based on $SiO_2$. For instance, the silicon-based carrier substrate may be a complete wafer, particularly a complete 200 mm or 300 mm (Si) wafer. The silicon-based substrate may be particularly an unstructured wafer.

In a second step 12 of the method 10, one compound semiconductor stack including an LED layer may be provided per each LED device (of the one or more LED devices) to be reconstituted over the carrier substrate. In other words, a compound semiconductor stack may be provided per LED device to be fabricated. If multiple LED devices are to be formed in parallel, a plurality of semiconductor stacks may be provided in, and before bonding them to the carrier substrate, they should be aligned with respect to the carrier substrate.

In a third step 13 of the method 10, a SiCN layer may be applied to the at least one compound semiconductor stack and to the silicon-based carrier substrate, respectively. In other words, a different SiCN layer may be provided to each stack and another SiCN layer may be provided to the carrier substrate.

In a fourth step 14 of the method 10, the at least one compound semiconductor stack may be finally bonded to the silicon-based carrier substrate. This requires at least contacting the SiCN layers applied on the at least one stack and the carrier substrate, respectively. In particular, during the bonding, these layers may be forced together by a bonding tool at determined process conditions.

In a fifth step 15 of the method 10, after the bonding step 14, a post-bond annealing may be applied. In particular, the bonded at least one compound semiconductor stack and the silicon-based carrier substrate can be annealed together at a temperature equal to or higher than a processing temperature, which may afterwards be used for completing an LED device from a stack. For instance, the post-bond annealing temperature may be selected to be equal to or higher than a temperature used for contact formation on each of the stacks used to complete the LED devices. In any case, the post-bond annealing temperature may be at least 400° C.

A method 100 according to an embodiment of the disclosure, which builds on the method 10 illustrated in the flow-diagram of FIG. 1, can be explained in more detail with respect to FIGS. 2-5.

Figure 2:
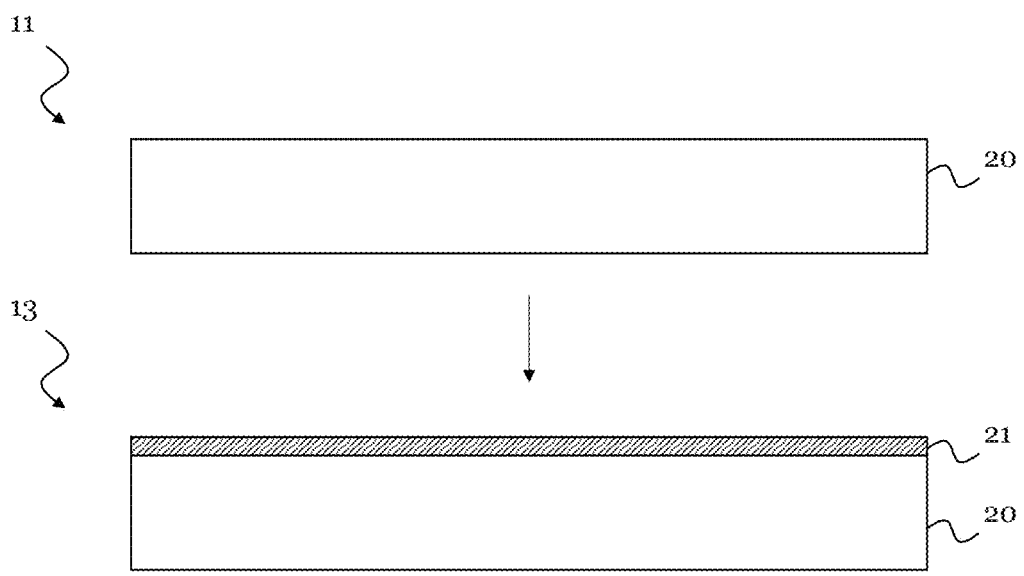
FIG. 2 shows steps for preparing a carrier substrate for bonding in a representative method according to an embodiment of the disclosure.

In particular, FIG. 2 shows the first step 11 and a part of the third step 13 of the method 10 shown in FIG. 1. Accordingly, FIG. 2 shows that a silicon-based carrier substrate 20 may be provided, and then a SiCN layer 21 may be applied to the carrier substrate 20. In particular, a surface of the silicon-based carrier substrate 20 may be at least partly, i.e. at least where the stacks are later to be bonded, covered with the SiCN layer 21, in order to create one or more bonding surfaces. Optionally, a SiN layer or a polished dielectric can be provided, as an intermediate layer, between the substrate surface and the SiCN layer(s) 21.

Figure 3:
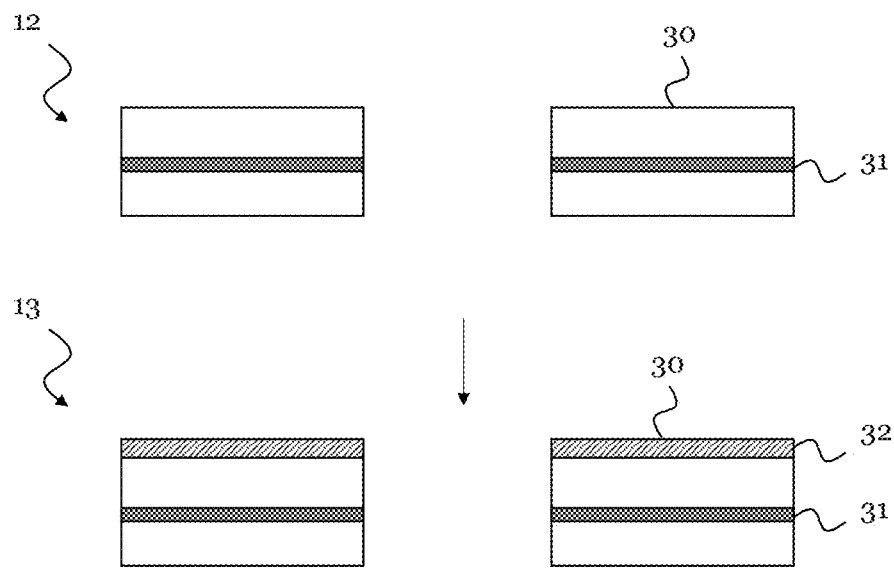
FIG. 3 shows steps for preparing compound semiconductor stacks for bonding in a representative method according to an embodiment of the disclosure.

FIG. 3 shows the second step 12 and part of the third step 13 of the method 10 shown in FIG. 1. Accordingly, FIG. 3 shows that one or more (here exemplarily two) compound semiconductor stacks 30 can be provided, each stack 30 including an LED layer 31. The stacks 30 can then be applied with a SiCN layer 32 each. The SiCN layers 32 can be applied as surface layers to each of the stacks 30. Like for the silicon-based carrier substrate 20, optionally a SiN layer or a polished dielectric can be provided in between each stack 30 and the SiCN layer 32, i.e. the SICN 32 layer may be applied onto the SiN layer. The SiCN layers 32 define a bonding surface per stack 30.

Before the actual bonding of the compound semiconductor stacks 30 to the silicon-based carrier substrate 20, the SiCN layers 32 and 21, respectively, may be planarized. In particular, they can be treated with a Chemical Mechanical Planarization (CMP) step, particularly in order to obtain a surface roughness of the SiCN layers 32 and 21 of below 1 nm, or even below 0.5 nm. Furthermore, it is possible to, alternatively or additionally, apply a pre-annealing step, before the bonding, but after applying the SiCN layers 32 and 21, for example, after planarizing them. A pre-bond annealing temperature may thereby be at least 400° C., or at least 500° C., or even at least 600° C., in order to achieve an efficient outgassing of the SiCN layers 32 and 21.

Figure 4:
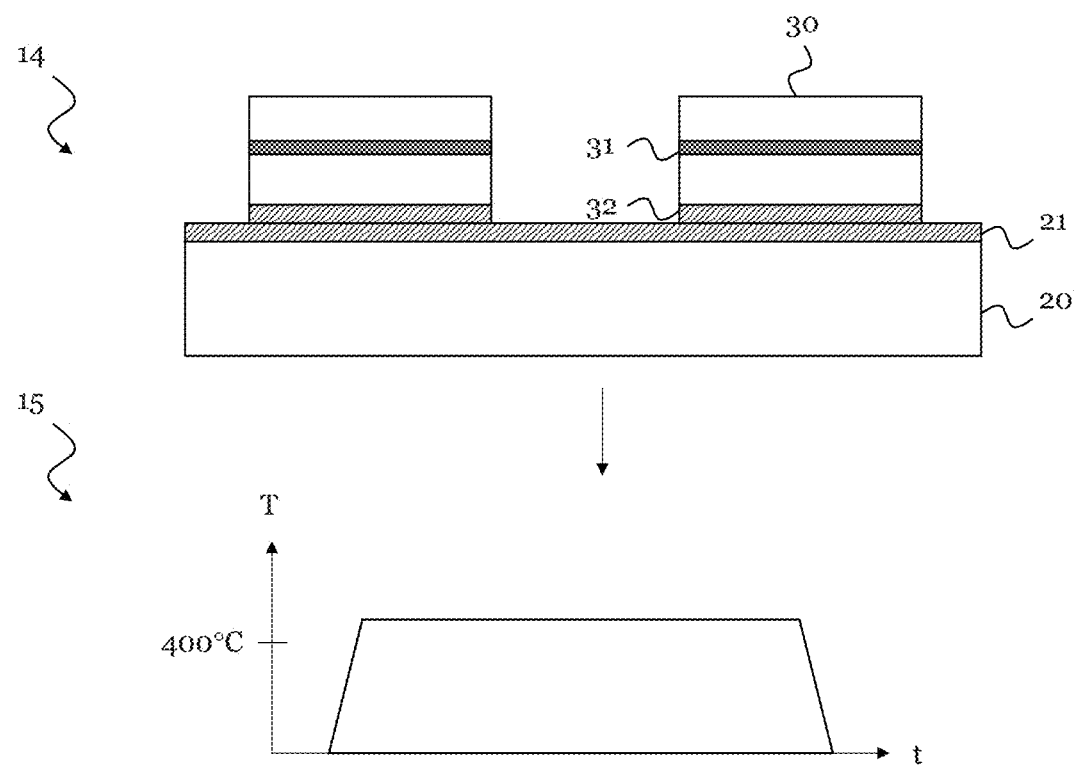
FIG. 4 shows steps for bonding of the compound semiconductor stacks to the carrier substrate and post-bond annealing.

FIG. 4 shows the fourth step 14 and the fifth step 15 of the method 10 shown in FIG. 1. Accordingly, FIG. 4 shows how the compound semiconductor stacks 30 may be aligned with and the bonded to the silicon-based carrier substrate 20. In particular, the SiCN layers 32 applied to the semiconductor stacks 30 can be contacted to the SiCN layer 21 provided on the silicon carrier substrate 20. Thereby, a bond can be formed under appropriate process conditions. In particular, the process conditions may be chosen as for conventionally known bonding techniques, i.e. regarding temperature, ambient pressure and mechanical pressure applied e.g. by a bonding tool, in order to push stacks 30 and carrier substrate 20 together. The temperature during bonding may be room temperature or any temperature up to the post-bond annealing temperature and usually not higher than 500° C. Ambient pressure may be low, but usually not lower as e.g. 10E-6 or 10E-7 mBar. The mechanical pressure may be 50-100 KN, but may also be less if sufficient.

The bonding strength of the created bonds can be significantly increased by then performing an annealing step at a temperature of at least 400° C. as schematically shown in FIG. 4. The bonding strength can be further improved by providing the low surface roughness achieved e.g. with CMP, which facilitates the formation of chemical bonds between the bonding surfaces.

Figure 5:
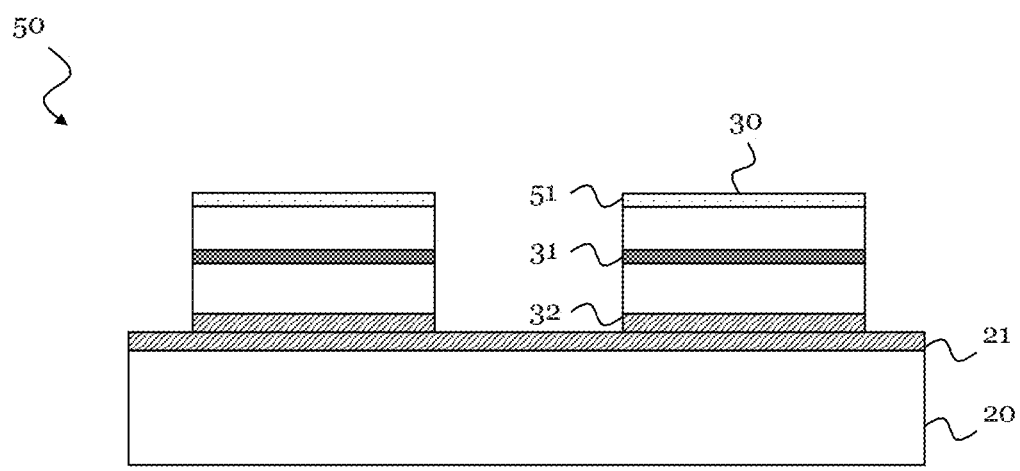
FIG. 5 shows a step related to the completion of LED devices from the bonded compound semiconductor stacks.

As shown in FIG. 5, after this post-bond annealing step 15, a plurality of compound semiconductor stacks 30 reconstituted over the silicon-based semiconductor carrier substrate 20 may be obtained. Each of these stacks 30 can then be completed into an LED device, wherein particularly a contact layer 51 may be applied to the free top-surface of each stack 30. For instance, a p-type contact may be formed on the compound semiconductor stacks 30 bonded to the silicon-based carrier substrate 20. However, completion of the LED device may also include structuring an LED array from each stack 30, i.e. form the LED layer of each stack 30.

A plurality of LED devices may be reconstituted in a determined alignment or pattern over the carrier substrate 20. For instance, in order to maximize the number of LED device that can be processed in parallel Each LED device may finally include a LED array. That is, a LED array may be structured at some point from each stack 30, particularly before forming a top contact on the stack 30, which may then contact the LED array from above. The LEDs in such a LED array may be arranged with a LED pixel pitch of between 1-10 µm, in particular even with a LED pixel pitch that is equal to or below 3 µm, thus forming a µLED array. Individual LED devices including such a µLED array each may be obtained, e.g. by dicing and packaging, from the semiconductor structure 50 shown in FIG. 5. The LED devices may be useful for a µLED display as, for instance, used in augmented reality applications. The LEDs in the LED array of an LED device may be GaN-based LEDs, or other III-V semiconductor based, or II-VI semiconductor based, or metal-nitride based LEDs.

In summary, the method presented by the disclosure includes a bonding of a compound semiconductor stack to a silicon-based carrier substrate with an increased bond strength, which can withstand high temperatures used in further processing steps. The method can be particularly useful in a process for fabricating an LED device with a µLED array.

What is claimed:

1. A method for obtaining one or more Light Emitting Diode (LED) devices, reconstituted over a carrier substrate, the method comprising:
   providing a silicon-based semiconductor substrate as the carrier substrate;
   providing a compound semiconductor stack including an LED layer per each of the one or more LED devices;
   applying a silicon carbon nitride (SiCN) layer to the stack and the substrate, respectively;
   bonding the stack to the substrate by contacting the SiCN layer applied to the stack and the SiCN layer applied to the substrate to form a bonded stack and substrate; and
   annealing the bonded stack and substrate at an annealing temperature equal to or higher than a processing temperature for completing the LED device from the stack, wherein the annealing and processing temperatures are at least 400° C.

2. The method according to claim 1, wherein the annealing temperature is equal to or higher than 550° C.

3. The method according to claim 1, wherein the annealing is performed for a duration ranging between 30 minutes and 5 hours.

4. The method according to claim 1, wherein the processing temperature for completing the LED device from the stack is equal to or lower than 550° C.

5. The method according to claim 1, wherein completing the LED device from the stack comprises forming a top contact on the stack to contact the LED layer.

6. The method according to claim 5, wherein the top contact is a p-type contact formation.

7. The method according to claim 1, wherein the silicon-based semiconductor substrate is in the form of a 300 mm wafer.

8. The method according to claim 1, wherein the compound semiconductor stack comprises a III-V semiconductor material compound, a II-VI semiconductor material compound, or a metal-nitride compound.

9. The method according to claim 1, wherein the compound semiconductor stack includes a GaN-based LED layer.

10. The method according to claim 1, wherein applying the SiCN layer comprises:
    forming a SiN layer or a polished dielectric on the stack and the substrate; respectively; and
    forming the SiCN layers on the respective SiN layers or polished dielectrics.

11. The method according to claim 1, further comprising performing planarization of the SiCN layers, before bonding, to obtain a surface roughness of the SiCN layers of below 1 nm.

12. The method according to claim 1, further comprising annealing, before bonding but after applying the SiCN layers, the stack and substrate at a temperature of at least 400° C.

13. The method according to claim wherein the temperature ranges between 400-600° C.

14. The method according to claim 12, wherein the annealing, before bonding, is performed for a duration ranging between 30 minutes and 5 hours.

15. The method according to claim 14, wherein the annealing is performed for a duration of 2 hours.

16. The method according to claim 1, wherein a plurality of the compound semiconductor stacks is provided corresponding to each of the plurality of LED devices, bonded to the substrate, and collectively annealed at the annealing temperature for obtaining a plurality of LED devices reconstituted over the carrier substrate.

17. The method according to claim 1, wherein the LED device includes a LED array that has an LED pixel pitch ranging between 1 µm to 10 µm.

18. The method according to claim 17, wherein the LED pixel pitch is equal to or below 3 µm.

* * * * *